United States Patent
Cha et al.

(10) Patent No.: US 11,125,825 B2
(45) Date of Patent: Sep. 21, 2021

(54) APPARATUS AND METHOD FOR MANAGING BATTERY

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

(*) Notice: Subject to any disclaimer, the term of this patent is extended or adjusted under 35 U.S.C. 154(b) by 303 days.

(21) Appl. No.: 16/093,793

(22) PCT Filed: Dec. 19, 2017

(86) PCT No.: PCT/KR2017/015053
§ 371 (c)(1),
(2) Date: Oct. 15, 2018

(87) PCT Pub. No.: WO2018/139764
PCT Pub. Date: Aug. 2, 2018

(65) Prior Publication Data
US 2019/0178951 A1    Jun. 13, 2019

(30) Foreign Application Priority Data
Jan. 24, 2017    (KR) .................... 10-2017-0011227

(51) Int. Cl.
*G01R 31/36* (2020.01)
*G01R 31/3842* (2019.01)
(Continued)

(52) U.S. Cl.
CPC ... *G01R 31/3842* (2019.01); *G01R 19/16542* (2013.01); *G01R 31/3648* (2013.01);
(Continued)

(58) Field of Classification Search
CPC .......... G01R 31/3842; G01R 19/16542; G01R 31/389; G01R 31/3648; H01M 10/48;
(Continued)

(56) References Cited

U.S. PATENT DOCUMENTS 6,388,426 B1    5/2002    Yokoo et al.
10,132,870 B2*  11/2018   Wang .................. H01M 10/482
(Continued)

FOREIGN PATENT DOCUMENTS

CN    101975927 A    2/2011
CN    102340165 A    2/2012
(Continued)

OTHER PUBLICATIONS

International Search Report for PCT/KR2017/015053 dated Jul. 16, 2018.

*Primary Examiner* — John E Breene
*Assistant Examiner* — Eyob Hagos
(74) *Attorney, Agent, or Firm* — Birch, Stewart, Kolasch & Birch, LLP

(57) ABSTRACT

Disclosed is an apparatus and method for managing a battery. The battery management apparatus according to an embodiment of the present disclosure includes a memory unit and a control unit. The memory unit is configured to store a plurality of discharge curve models including a first discharge curve model associated with a first state of charge value, and in this instance, the first discharge curve model defines a change in voltage of a battery having the first state of charge value over time under a first discharge condition. The control unit is connected to the memory unit, allowing communication with the memory unit, and is configured to call the first discharge curve model stored in the memory unit.

11 Claims, 12 Drawing Sheets

(51) Int. Cl.
*H01M 10/42* (2006.01)
*H01M 10/44* (2006.01)
*H01M 10/48* (2006.01)
*G01R 19/165* (2006.01)
*G01R 31/389* (2019.01)

(52) U.S. Cl.
CPC ........ *G01R 31/389* (2019.01); *H01M 10/425* (2013.01); *H01M 10/44* (2013.01); *H01M 10/48* (2013.01); *H01M 10/486* (2013.01); *H01M 2010/4271* (2013.01); *H01M 2010/4278* (2013.01); *H01M 2220/20* (2013.01)

(58) Field of Classification Search
CPC .. H01M 10/425; H01M 10/44; H01M 10/486; H01M 2010/4278; H01M 2220/20; H01M 2010/4271; H01M 10/4285; H01M 10/443; H01M 10/448; Y02E 60/10
See application file for complete search history.

(56) References Cited

U.S. PATENT DOCUMENTS

| | | | |
|---|---|---|---|
| 2002/0109506 A1* | 8/2002 | Kawakami | G01R 31/392 324/522 |
| 2005/0173985 A1 | 8/2005 | Eguchi et al. | |
| 2006/0087291 A1* | 4/2006 | Yamauchi | H02J 7/0063 320/137 |
| 2006/0246329 A1* | 11/2006 | Gopal | H01M 8/04597 429/431 |
| 2007/0166617 A1* | 7/2007 | Gozdz | H01M 4/136 429/231.95 |
| 2008/0048616 A1 | 2/2008 | Paul et al. | |
| 2008/0136375 A1 | 6/2008 | Nam et al. | |
| 2010/0001693 A1* | 1/2010 | Iida | H01M 10/425 320/134 |
| 2010/0019727 A1* | 1/2010 | Karden | G01R 31/382 320/129 |
| 2011/0210859 A1 | 9/2011 | Kim | |
| 2012/0072146 A1* | 3/2012 | Hsu | G01R 31/367 702/63 |
| 2013/0307488 A1* | 11/2013 | Hwang | H02J 7/0045 320/161 |
| 2014/0111164 A1 | 4/2014 | Ohkawa et al. | |
| 2014/0312910 A1* | 10/2014 | Cho | G01R 31/3842 324/426 |
| 2015/0066407 A1 | 3/2015 | Joe et al. | |
| 2015/0108950 A1 | 4/2015 | Yun | |
| 2015/0108991 A1* | 4/2015 | Aoshima | G01R 31/3648 324/430 |
| 2015/0137822 A1 | 5/2015 | Joe et al. | |
| 2016/0149418 A1 | 5/2016 | Jung | |
| 2017/0062878 A1* | 3/2017 | Povey | B60L 58/22 |
| 2017/0123011 A1 | 5/2017 | Cha et al. | |
| 2017/0151885 A1* | 6/2017 | Kim | B60L 58/21 |
| 2018/0269503 A1* | 9/2018 | Bowman | H01M 8/04302 |

FOREIGN PATENT DOCUMENTS

| | | |
|---|---|---|
| CN | 102355021 A | 2/2012 |
| CN | 102754272 A | 10/2012 |
| CN | 104166102 A | 11/2014 |
| CN | 104380129 A | 2/2015 |
| CN | 104395771 A | 3/2015 |
| CN | 105633495 A | 6/2016 |
| EP | 2 001 074 A1 | 12/2008 |
| JP | 2001-95158 A | 4/2001 |
| JP | 2006-338944 A | 12/2006 |
| JP | 2007-163145 A | 6/2007 |
| JP | 2011-257411 A | 12/2011 |
| JP | 2014-92471 A | 5/2014 |
| KR | 10-2006-0041711 A | 5/2006 |
| KR | 10-2006-0052273 A | 5/2006 |
| KR | 10-2012-0082965 A | 7/2012 |
| KR | 10-1418883 B1 | 7/2014 |
| KR | 10-1432536 B1 | 8/2014 |
| KR | 10-2014-0125473 A | 10/2014 |
| KR | 10-2015-0046638 A | 4/2015 |
| KR | 10-2016-0094882 A | 8/2016 |
| WO | WO 2013/175606 A1 | 12/2006 |

* cited by examiner

APPARATUS AND METHOD FOR MANAGING BATTERY

TECHNICAL FIELD

The present application claims priority to Korean Patent Application No. 10-2017-0011227 filed in the Republic of Korea on Jan. 24, 2017, the disclosures of which are incorporated herein by reference.

The present disclosure relates to an apparatus and method for managing a battery, and more particularly, to an apparatus and method for protecting a battery based on the charge/discharge characteristics of the battery.

BACKGROUND ART

Batteries can be repeatedly charged and discharged, and thus they are used as a source of power in various fields. For example, lithium ion batteries area used in handheld devices such as mobile phones, laptop computers, digital cameras, video cameras, tablet computers and electric tools, as well as various types of electric power systems including e-bikes, electric motorcycles, electric vehicles, hybrid electric vehicles, electric ship and electric aircraft.

A battery is connected to a load device through a power conversion device such as an inverter. The load device refers to any device using power stored in the above-mentioned battery.

The load device includes a control system. The control system receives the output parameter of the battery from an apparatus that manages the charge/discharge of the battery (hereinafter referred to a battery management apparatus) via communication.

The output parameter is an indication of the discharge performance or the charge performance of the battery, and is updated based on the state of charge and the temperature of the battery. The output parameter may include information associated with a maximum charge/discharge current value that may be permitted to flow through the battery when the battery is discharged or charged or an allowed power calculated therefrom.

The control system controls the charge and discharge of the battery in the range of output parameter received from the battery management apparatus. That is, the control system regulates the output of the battery below the allowed output value or the magnitude of the charge or discharge current below the maximum charge/discharge current value by controlling the power conversion device.

Meanwhile, the voltage of the battery rapidly changes when it is close to a preset lower limit of discharge voltage (or a preset upper limit of charge voltage). Here, the lower limit of discharge voltage and the upper limit of charge voltage may be preset to prevent overdischarge and overcharge, respectively.

FIG. 1 is a graph showing voltage changes appearing during discharging with the constant current of 360 A when the state of charge of a lithium battery with the full charge capacity of 360 Ah is 20%. As the battery is discharged for a short time of about a few seconds to a few tens of seconds using a relatively large current such as the constant current of 360 A, it is said that the capacity of the battery is constantly maintained before and after discharge.

As can be seen through the graph shown in FIG. 1, when the voltage of the battery reaches a particular voltage value $V_s$ that is higher than the lower limit of discharge voltage $V_{min}$, the voltage rapidly drops at a high rate.

Similar to this, a sharp change in voltage may also take place in a situation in which the battery is charged. That is, as the voltage of the battery is closer to the upper limit of charge voltage, the voltage rapidly rises at a high rate. One of the causes of the sharp change in battery voltage is a sharp change in internal resistance dependent on the state of charge of the battery.

The sharp change in battery voltage indicates a risk that the battery will be overcharged or overdischarged soon. Accordingly, when a sharp change in voltage across the two ends of the battery is monitored, the battery management apparatus needs to appropriately adjust the magnitude of the discharge current or charge current of the battery. That is, to solve a problem that the voltage of the battery is lower than the lower limit of discharge voltage or higher than the upper limit of charge voltage, the battery management apparatus needs to appropriately derate the allowed output parameter of the battery.

DISCLOSURE

Technical Problem

The present disclosure is devised under the background of the related art as described above, and therefore, the present disclosure is directed to providing an apparatus and method that calculates a current derating ratio for determining an allowed upper limit value of charge/discharge current of a battery based on the state of charge and the temperature of the battery to protect the battery from overdischarge or overcharge.

Technical Solution

To achieve the above-described technical object, a battery management apparatus according to an aspect of the present disclosure includes a memory unit configured to store a plurality of discharge curve models including a first discharge curve model associated with a first state of charge value, wherein the first discharge curve model defines a change in voltage of a battery having the first state of charge value over time under a first discharge condition, and a control unit connected to the memory unit, allowing communication with the memory unit, and configured to call the first discharge curve model stored in the memory unit. The control unit is configured to calculate, from the first discharge curve model, a first time change amount from a first point in time in which the first discharge curve model meets a discharge setting voltage value that is set higher than a lower limit value of discharge voltage of the battery to a second point in time in which the first discharge curve model meets the lower limit value of discharge voltage, calculate a first derating current value for a first temperature value based on the lower limit value of discharge voltage, the discharge setting voltage value and the first time change amount, calculate a first current derating ratio indicating a relative size of the first derating current value to a first maximum discharge current value mapped to the first state of charge value, and store the first current derating ratio in association with the first state of charge value and the first temperature value in the memory unit.

Additionally, the control unit calculates the first derating current value further based on the first maximum discharge current value, a first factor and a second factor. In this instance, the first factor is a first internal resistance value of the battery mapped to the first temperature value, and the second factor is a first maximum resistance change ratio of the battery mapped to the first temperature value.

Additionally, the control unit calculates the first derating current value using the following Equation 1:

$$I_{D\_derate} = \frac{V_{min} - V_{D\_set} + I_{D\_max} \times R_0}{R_0 + \left(\frac{dR}{dt}\right)_{D\_max} \Delta t_D} \quad \text{[Equation 1]}$$

where $I_{D\_max}$ is the first maximum discharge current value, $V_{min}$ is the lower limit of discharge voltage, $V_{D\_set}$ is the discharge setting voltage, $R_0$ is the first internal resistance value, $\Delta t_D$ is the first time change amount, $(dR/dt)_{D\_max}$ is the first maximum resistance change ratio, and $I_{D\_derate}$ is the first derating current value.

Additionally, the control unit may be configured to calculate a second derating current value for a second temperature value based on the lower limit value of discharge voltage, the discharge setting voltage value, the first time change amount, a third factor and a fourth factor. In this instance, the third factor is a second internal resistance value of the battery mapped to the second temperature value, and the fourth factor is a second maximum resistance change ratio of the battery mapped to the second temperature value.

Additionally, the control unit may be configured to calculate a second current derating ratio indicating a relative size of the second derating current value to the first maximum discharge current value, and store the second current derating ratio in association with the first state of charge value and the second temperature value in the memory unit.

Additionally, the memory unit may be configured to further store a second state of charge value that is different from the first state of charge value and a second discharge curve model associated with the second state of charge value. In this instance, the second discharge curve model defines a change in voltage of the battery having the second state of charge value over time under a second discharge condition.

Additionally, the control unit may be configured to calculate, from the second discharge curve model, a second time change amount from a third point in time in which the second discharge curve model meets the discharge setting voltage value to a fourth point in time in which the second discharge curve model meets the lower limit value of discharge voltage, calculate a third derating current value for a third temperature value based on the lower limit value of discharge voltage, the discharge setting voltage value and the second time change amount, calculate a third current derating ratio indicating a relative size of the third derating current value to a second maximum discharge current value mapped to the second state of charge value, and store the third current derating ratio in association with the second state of charge value and the third temperature value in the memory unit.

Additionally, the control unit may calculate the third derating current value further based on the second maximum discharge current value, a fifth factor and a sixth factor. In this instance, the fifth factor is a third internal resistance value of the battery mapped to the third temperature value, and the sixth factor is a third maximum resistance change ratio of the battery mapped to the third temperature value.

Additionally, the control unit is configured to calculate a fourth derating current value for a fourth temperature value based on the lower limit value of discharge voltage, the discharge setting voltage value, the second time change amount, a seventh factor and an eighth factor. In this instance, the seventh factor is a fourth internal resistance value of the battery mapped to the fourth temperature value, and the eighth factor is a fourth maximum resistance change ratio of the battery corresponding to the fourth temperature value.

Additionally, the control unit may be configured to calculate a fourth current derating ratio indicating a relative size of the fourth derating current value to the second maximum discharge current value, and store the fourth current derating ratio in association with the second state of charge value and the fourth temperature value in the memory unit.

Additionally, when the second temperature value is equal to the third temperature value, the control unit may set a larger current derating ratio of the second current derating ratio and the third current derating ratio as a representative derating ratio for the third temperature value.

Additionally, the battery management apparatus may further include a voltage measuring unit configured to measure a discharge voltage of the battery, a current measuring unit configured to measure a current of the battery, and a temperature measuring unit configured to measure a temperature of the battery. In this instance, the control unit may be configured to estimate a current state of charge value of the battery based on a voltage value, a current value and a temperature value measured by the voltage measuring unit, the current measuring unit and the temperature measuring unit, when the voltage of the battery is equal to or less than the discharge setting voltage value, obtain a representative derating ratio mapped to the current state of charge value and the temperature value from the memory unit, and determine an upper limit value of discharge current of the battery using the obtained representative derating ratio.

Additionally, the memory unit may further store a plurality of preset safety standard values. In this case, the control unit may allocate the plurality of safety standard values to the discharge setting voltage value in a sequential order according to a preset rule, and calculate the first current derating ratio in a state that each safety standard value is set as the discharge setting voltage value.

A battery management apparatus according to another aspect of the present disclosure includes a memory unit configured to store a plurality of charge curve models including a first charge curve model associated with a first state of charge value, wherein the first charge curve model defines a change in voltage of a battery having the first state of charge value over time under a first charge condition, and a control unit connected to the memory unit, allowing communication with the memory unit, and configured to call the first charge curve model stored in the memory unit. The control unit is configured to calculate, from the first charge curve model, a first time change amount from a first point in time in which the first charge curve model meets a charge setting voltage value that is set lower than an upper limit value of charge voltage of the battery to a second point in time in which meets the upper limit value of charge voltage. The control unit is configured to calculate a first derating current value for a first temperature value based on the upper limit value of charge voltage, the charge setting voltage value and the first time change amount. The control unit is configured to calculate a first current derating ratio indicating a relative size of the first derating current value to a first maximum charge current value mapped to the first state of charge value. The control unit is configured to store the first current derating ratio in association with the first state of charge value and the first temperature value in the memory unit.

A battery management method according to still another aspect of the present disclosure includes calling a first discharge curve model associated with a first state of charge value from a plurality of pre-stored discharge curve models, wherein the first discharge curve model defines a change in voltage of a battery having the first state of charge value over time under a first discharge condition, calculating, from the first discharge curve model, a first time change amount from a first point in time in which the first discharge curve model meets a discharge setting voltage value that is set higher than a lower limit value of discharge voltage of the battery to a second point in time in which the first discharge curve model meets the lower limit value of discharge voltage, calculating a first derating current value for a first temperature value based on the lower limit value of discharge voltage, the discharge setting voltage value, the first time change amount, a first factor and a second factor, wherein the first factor is a first internal resistance value of the battery mapped to the first temperature value, and the second factor is a first maximum resistance change ratio of the battery mapped to the first temperature value, calculating a first current derating ratio indicating a relative size of the first derating current value to a first maximum discharge current value mapped to the first state of charge value, and storing the first current derating ratio in association with the first state of charge value and the first temperature value in the memory unit.

Advantageous Effects

According to at least one of the embodiments of the present disclosure, a battery's current derating ratio as a function of a state of charge value and a temperature value may be pre-calculated using at least one discharge curve model or charge curve model obtained through previous experiments.

Additionally, according to at least one of the embodiments of the present disclosure, when the voltage of the battery being charged/discharged reaches a preset setting voltage, an upper limit value of charge/discharge current may be determined based on a preset current derating ratio corresponding to the current state of charge and temperature of the battery. Thus, the charge/discharge current of the battery may be limited below the upper limit value within the sharp voltage change range (for example, the shadowed range in FIG. 1). Accordingly, the battery may be effectively protected from at least one of overdischarge and overcharge.

Additionally, according to at least one of the embodiments of the present disclosure, the upper limit value of discharge current may be determined differently for each safety standard value by presetting a plurality of available safety standard values that can be used as the discharge setting voltage value.

BRIEF DESCRIPTION OF THE DRAWINGS

The accompanying drawings illustrate an embodiment of the present disclosure and together with the following detailed description, serve to provide further understanding of the technical aspects of the present disclosure, and thus, the present disclosure is not construed as being limited to the statements in such drawings.

MODE FOR CARRYING OUT THE INVENTION

Figure 1:
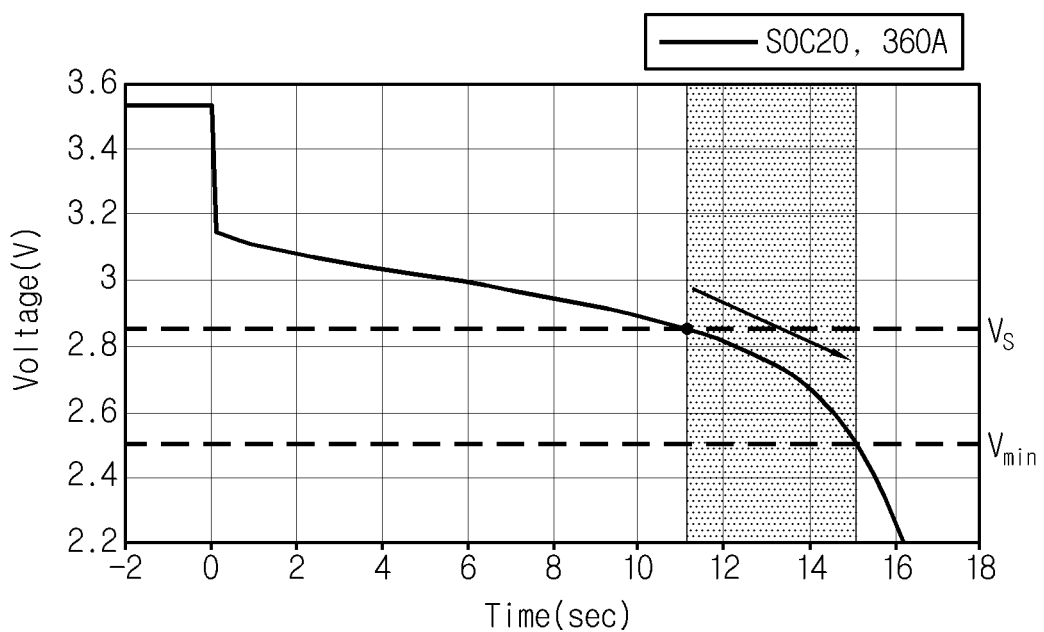
FIG. 1 is a discharge curve model showing voltage change modeling during discharging with the constant current of 360 A when the state of charge of a lithium battery with the capacity of 36 Ah is 20%.

Hereinafter, embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define the terms appropriately for the best explanation. Therefore, the embodiments described herein and illustrations shown in the drawings are just an embodiment of the present disclosure, but not intended to fully describe the technical aspects of the present disclosure, so it should be understood that various other equivalents and modifications could be made thereto at the time the invention was made.

In the embodiments described below, a battery refers to a lithium battery. Here, the lithium battery refers collectively to batteries in which lithium ions act as working ions during charging and discharging, causing electrochemical reactions at the positive electrode and the negative electrode.

Meanwhile, it should be interpreted as that even though the name of the battery changes depending on the type of electrolyte or separator used in the lithium battery, the type of packaging used to package the battery and the internal or external structure of the lithium battery, the lithium battery covers any battery using lithium ions as working ions.

The present disclosure may be also applied to batteries other than lithium batteries. Accordingly, it should be interpreted as that the present disclosure covers any battery to which the technical aspects of the present disclosure may be applied irrespective of the type, even though working ions are not lithium ions.

Additionally, the battery is not limited to the number of elements that constitute it. Accordingly, it should be interpreted that the battery includes a unit cell including an assembly of positive electrode/separator/negative electrode and an electrolyte in a packaging as well as an assembly including unit cells connected in series and/or in parallel, a module including assemblies connected in series and/or in parallel, a pack including modules connected in series and/or in parallel, and a battery system including packs connected in series and/or in parallel.

Figure 2:
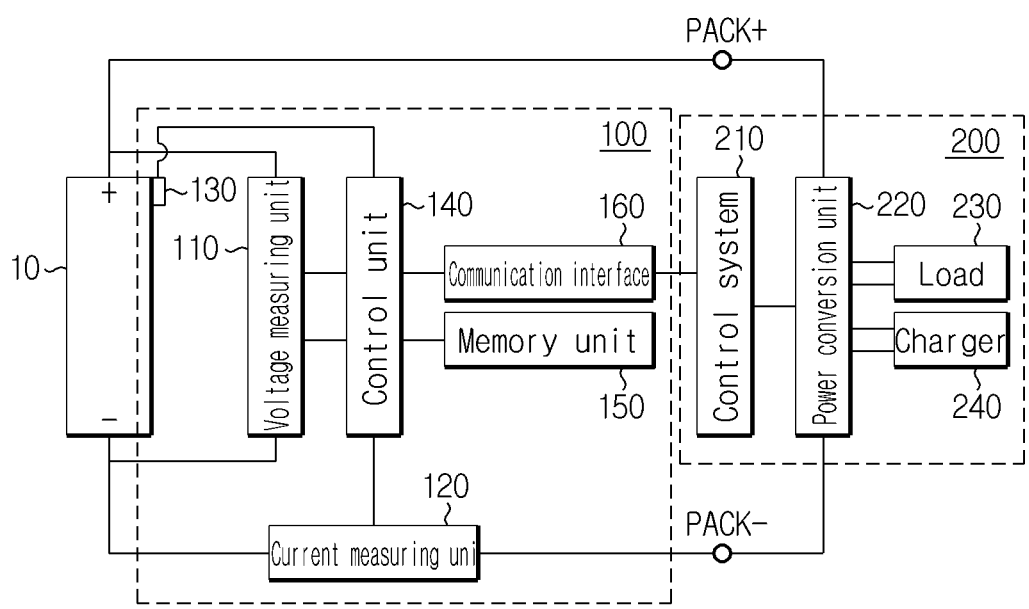
FIG. 2 is a block diagram of an output parameter adjustment system of a battery according to an embodiment of the present disclosure.

FIG. 2 is a block diagram showing an apparatus 100 according to an embodiment of the present disclosure.

Referring to FIG. 2, the apparatus 100 according to an embodiment of the present disclosure basically includes a memory unit 150 and a control unit 140, and optionally, may further include at least one of a voltage measuring unit 110, a current measuring unit 120, a temperature measuring unit 130 and an information output unit.

The apparatus 100 may derate the current of a battery 10 after the point in time in which the voltage of the battery 10 being charged/discharged is equal to a preset setting voltage. For example, when the voltage of the battery 10 being charged reaches the charge setting voltage, the apparatus 100 may derate the charge current of the battery 10, and when the voltage of the battery 10 being discharged reaches the discharge setting voltage, may derate the discharge current of the battery 10. Of course, the charge setting voltage may be preset to have a higher level than the discharge setting voltage.

The battery 10 is electrically connected to a load device 200 through a high potential terminal (PACK+) and a low potential terminal (PACK−). The load device 200 refers to a device that operates with power outputted from the battery 10.

The load device 200 includes a control system 210, a power conversion unit 220 and a load 230. Optionally, the load device 200 may further include a charger 240. The charger 240 may supply the charge current for charging the battery 10 to the battery 10 through the power conversion unit 220. The charger 240 may produce the charge current itself, and may produce the charge current by receiving power from a commercial power source.

In a preferred example, the load 230 may be a motor included an electric vehicle or a hybrid electric vehicle, and the power conversion unit 220 may be an inverter capable of bi-directional power conversion.

The control system 210 is a computing system that controls the overall operation of the load device 200. Particularly, the control system 210 controls the discharge of the battery 10 using the output parameter of the battery 10 provided by the control unit 140. That is, the control system 210 controls the discharge of the battery 10 by controlling the power conversion unit 220 based on the discharge condition corresponding to the output parameter.

The power conversion unit 220 transmits the discharge output of the battery 10 to the load 230. In this instance, the power conversion unit 220 may adjust the extent of power conversion to discharge the battery 10 in the range of output parameter under the control of the control system 210.

On the contrary, the power conversion unit 220 may transmit the charge output supplied from the charger 240 to the battery 10. In this instance, the power conversion unit 220 may adjust the extent of power conversion to charge the battery 10 in the range of output parameter under the control of the control system 210.

The memory unit 150 is not limited to a particular type of storage medium when it can record and delete information. For example, the memory unit 150 may include RAM, ROM, register, hard disk, an optical recording medium or a magnetic recording medium. The memory unit 150 may be electrically connected to the control unit 140, for example, through a data bus, to allow the control unit 140 to access it. Additionally, the memory unit 150 is connected to the control unit 140 allowing communication, to store and/or update and/or delete and/or transmit programs including various types of control logics executed by the control unit 140 and/or data created when the control logic is executed. The memory unit 150 can be logically divided into two or more, and may be included in the control unit 140 without limitations.

The voltage measuring unit 110 is electrically coupled with the control unit 140 to transmit and receive electrical signals. The voltage measuring unit 110 measures the voltage applied between the positive electrode and the negative electrode of the battery 10 at a time interval under the control of the control unit 140, and outputs a signal indicating the magnitude of the measured voltage to the control unit 140. The control unit 140 determines the voltage of the battery 10 from the signal outputted from the voltage measuring unit 110, and stores a value of the determined voltage in the memory unit 150. For example, the voltage measuring unit 110 may include a voltage measurement circuit commonly used in the art.

The current measuring unit 120 is electrically coupled with the control unit 140 to transmit and receive electrical signals. The current measuring unit 120 repeatedly measures the magnitude of the current flowing through the battery 10 at a time interval under the control of the control unit 140 and outputs a signal indicating the measured magnitude of the current to the control unit 140. The control unit 140 determines the magnitude of the current from the signal outputted from the current measuring unit 120 and stores the determined current value in the memory unit 150. For example, the current measuring unit 120 may include a hall sensor or a sense resistor commonly used in the art.

The temperature measuring unit 130 is electrically coupled with the control unit 140 to transmit and receive electrical signals. The temperature measuring unit 130 repeatedly measures the temperature of the battery 10 at a time interval and outputs a signal indicating the magnitude of the measured temperature to the control unit 140. The control unit 140 determines the temperature of the battery 10 from the signal outputted from the temperature measuring unit 130 and stores a value of the determined temperature in the memory unit 150. For example, the temperature measuring unit 130 may include a thermocouple commonly used in the art.

The apparatus 100 according to the present disclosure may further include a communication interface 160. The communication interface 160 is a component necessary for the control unit 140 to communicate with the control system 210 included in the load device 200.

The communication interface 160 includes any known communication interface that supports communication between two different systems. The communication interface may support wired or wireless communication. Preferably, the communication interface may support controller area network (CAN) communication or daisy chain communication.

The control unit 140 may determine the state of charge of the battery 10 by selectively using at least one of the voltage of the battery 10 measured by the voltage measuring unit 110 and the current of the battery 10 measured by the current measuring unit 120 and the temperature of the battery 10 measured by the temperature measuring unit 130.

For example, the state of charge of the battery 10 may be determined by integration of the current values periodically measured through the current measuring unit 120. This method is also known as Ampere-hour counting method, and its detailed description is omitted herein. As another example, the state of charge of the battery 10 may be determined by determining an open-circuit voltage based on the voltage values periodically measured through the voltage measuring unit 110 and referring to an OCV-SOC table pre-stored in the memory. As still another example, the state of charge may be determined using an adaptive algorithm such as the extended Kalman filter based on circuit modeling of the battery 10.

Of course, besides the Ampere-hour counting method or the extended Kalman filter described above, the state of charge may be determined by other know methods for estimating the state of charge selectively using the voltage, temperature and current of the battery 10.

The control unit 140 monitors the voltage level of the battery 10 measured by the voltage measuring unit 110 during discharging of the battery 10. The control unit 140 may determine whether the battery 10 is being charged or discharged based on the direction of the current measured by the current measuring unit 120.

The control unit 140 differently determines the output parameter of the battery 10 depending on the voltage level of the battery 10. Specifically, when the voltage of the battery 10 being discharged resides in a plateau voltage range, the control unit 140 may determine the output parameter in normal mode. On the contrary, when the voltage of the battery 10 enters a voltage drop range or a voltage rise range beyond the plateau voltage range, the control unit 140 may determine the output parameter in derating mode. In this instance, the plateau voltage range and the voltage drop range may be classified on the basis of a preset discharge setting voltage. Additionally, the plateau voltage range and the voltage rise range may be classified on the basis of a charge setting voltage that is preset to be higher than the discharge setting voltage. That is, the voltage drop range is a region corresponding to the voltage range below the discharge setting voltage, the voltage rise range is a region corresponding to the voltage range that is equal to or larger than the charge setting voltage, and the plateau voltage range is a region corresponding to the voltage range that is larger than the discharge setting voltage and smaller than the charge setting voltage.

First, constant current discharge experiments may be carried out while maintaining the same temperature for each preset state of charge value of the battery 10 to obtain a plurality of discharge curve models.

Figure 3:
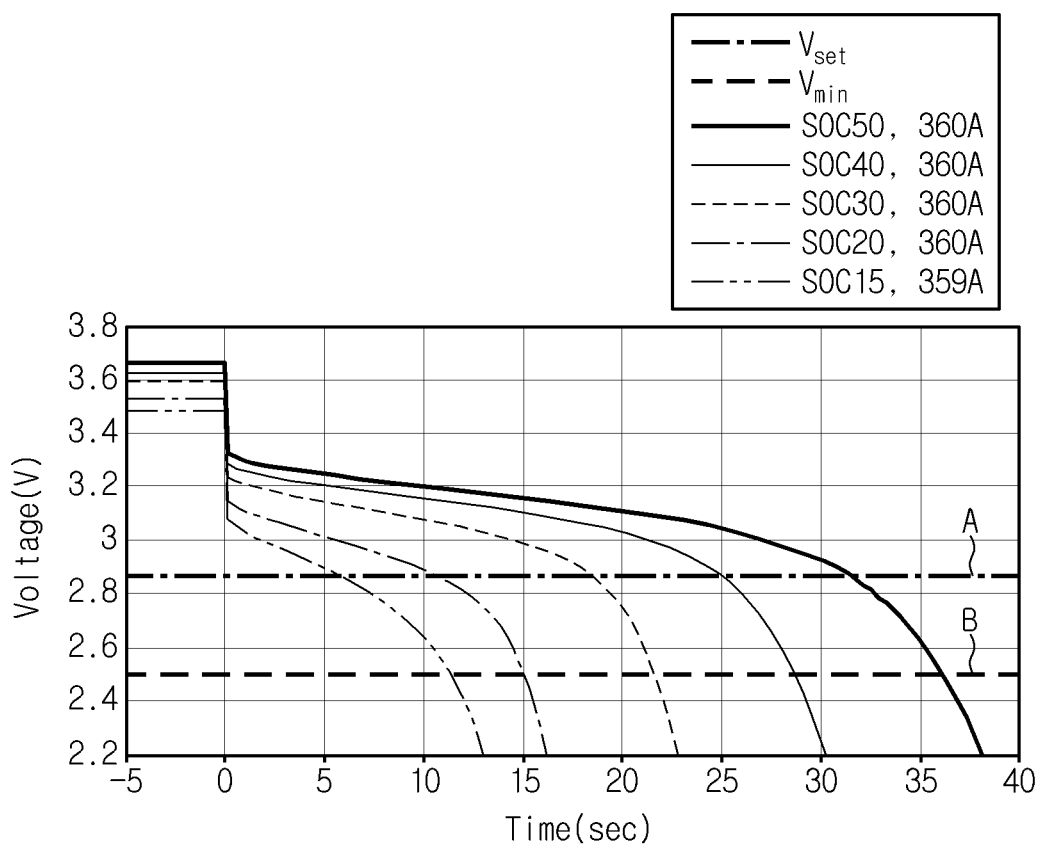
FIG. 3 are graphs showing discharge curve models of five lithium batteries with the same full charge capacity of 36 Ah and different states of charge of 15%, 20%, 30%, 40% and 50%.

FIG. 3 are graphs showing the discharge curve models of five lithium batteries with the same maximum full charge capacity of 36 Ah and different states of charge of 15%, 20%, 30%, 40% and 50%. As it goes from left to right, the state of charge value corresponding to each discharge curve model is larger.

The magnitude of the discharge current applied to each constant current discharge experiment is a maximum discharge current value corresponding to the state of charge and the temperature of the battery 10. The maximum discharge current value corresponding to particular state of charge and temperature is a discharge current value that causes the voltage of the battery 10 to reach the lower limit of discharge voltage $V_{min}$ when pulse discharging the battery 10 by the hybrid pulse power characterization (HPPC) method.

Preferably, when the maximum discharge current value determined by the HPPC method is larger than the upper limit of discharge current value set for safety of the battery 10, the maximum discharge current value may be replaced with the upper limit of discharge current value.

In the constant current discharge experiment for obtaining the discharge curve models shown in FIG. 3, the upper limit of discharge current value was set to 360 A.

In FIG. 3, the maximum discharge current value applied when obtaining each discharge curve model is indicated on the right side of the graph. That is, the maximum discharge current values corresponding to the state of charge of 15%, 20%, 30%, 40% and 50% are equally 360 A. In the state of charge of 20%, 30%, 40% and 50%, because the maximum discharge current value determined by the HPPC method exceeds 360 A (ampere) set as the upper limit of discharge current value, the maximum discharge current value is replaced with the upper limit of discharge current value. While when the SOC of the battery 10 is 10% and 15%, because the maximum discharge current value 359 A determined by the HPPC method is smaller than the upper limit of discharge current value 360 A, 359 A determined by the HPPC method is applied.

In FIG. 3, the horizontal line A represents the level of the preset discharge setting voltage $V_{D\_set}=V_{set}$, and the horizontal line B represents the level of the lower limit of discharge voltage $V_{min}$. In this instance, the discharge setting voltage $V_{D\_set}$ may be equal to any one of the preset safety standard values. For example, when the lower limit of discharge voltage $V_{min}$ is 1.5V, three safety standard values corresponding to, 2.6V, 2.3V and 2.0V may preset.

As above, when the preset safety standard values are set as the discharge setting voltage $V_{D\_set}$ in a sequential order, the control unit 140 may calculate a derating current value and a current derating ratio based on the state of charge and the temperature. In this instance, when the maximum discharge current value is fixed, as the derating current value reduces, the current derating ratio increases. That is, the derating current value and the current derating ratio may have an inversely proportional relationship.

Additionally, the control unit 140 may fully extend the time taken for the voltage of the battery 10 to reach the lower limit of discharge voltage $V_{min}$ by derating the output parameter of the battery 10, in particular, the discharge current based on the calculated current derating ratio.

Additionally, the control unit 140 may detect each of a first point in time in which each discharge curve model intersects the horizontal line A and a second point in time in which each discharge curve model intersects the horizontal line B, and calculate a time change amount, i.e., an elapsed time from the detected first point in time to the detected second point in time.

The control unit 140 determines the output parameter in normal mode when the current voltage of the battery 10 measured through the voltage measuring unit 110 is larger than the preset discharge setting voltage $V_{D\_set}$. The normal mode may refer to a mode in which no restriction is applied to the discharge current of the battery 10, as opposed to derating mode as described below. That is, the control unit 140 may always operate in normal mode while the control unit 140 does not operate in derating mode.

The output parameter determined during discharging includes at least one of the maximum discharge current value and the current derating ratio of the battery 10 or its associated parameter. The control unit 140 may determine the maximum discharge current value for each state of charge using a first current map pre-stored in the memory unit 150. Here, the first current map may have a data structure in the form of a lookup table that defines the maximum discharge current value associated with each of the plurality of state of charge values.

The allowed power value $P_D$ may be determined by the following Equation 1.

$$P_D = V_{min} \times I_{D\_max} \qquad [\text{Equation 1}]$$

In Equation 1, $V_{min}$ denotes the lower limit of discharge voltage of the battery 10 and is a preset value. $I_{D\_max}$ corresponds to the maximum discharge current value that can be applied to the battery 10 being discharged in a particular state of charge.

Meanwhile, when the voltage of the battery 10 measured through the voltage measuring unit 110 drops below the discharge setting voltage $V_{D\_set}$ (i.e., falling in the voltage drop range), the control unit 140 shifts the normal mode to derating mode and determines the output parameter in derating mode. In this instance, prior to the operation of determining the output parameter, the control unit 140 may perform an operation for determining a current derating ratio corresponding to at least one preset state of charge value and at least one preset temperature value. To this end, a plurality of discharge curve models may be pre-stored in the memory unit 150. Each discharge curve mode pre stored in the memory unit 150 may be associated with each of the plurality of state of charge values one-to-one.

Hereinafter, for convenience of description, assume that at least a first discharge curve model and a second discharge curve model are stored in the memory unit 150. Here, the first discharge curve model may define voltage changes of the battery 10 having a first state of charge value over time under first discharge condition, and the second discharge curve model may define voltage changes of the battery 10 having a second state of charge value over time under second discharge condition. As described previously with reference to FIG. 3, the first discharge condition may be under which the battery 10 is discharged below the lower limit of discharge voltage with a first maximum discharge current value corresponding to the first state of charge value at a designated temperature (for example, 25° C.), and the second discharge condition may be under which the battery 10 is discharged with the second maximum discharge current value below the lower limit of discharge voltage with a second maximum discharge current value corresponding to the second state of charge value at the same temperature as the first discharge condition.

Additionally, a parameter determined while the control unit 140 operates in derating mode includes at least one of the derating current value and the target power derating value of the battery 10.

Specifically, the control unit 140 may call each of the pre-stored discharge curve models from the memory unit 150 one by one or two or more at once. The discharge curve model currently called from the memory unit 140 by the control unit 140 is referred to as a 'target curve model'.

The control unit 140 detects each of a point in time in which the target curve model meets the discharge setting voltage value and a point in time in which the target curve model meets the lower limit value of discharge voltage from the target curve model. From this, the control unit 140 may calculate a time change amount representing the time between the detected two points in time. That is, the time change amount is a value obtained by subtracting a smaller one of the two points in time from a larger one.

Subsequently, the control unit 140 may calculate a derating current value for at least one temperature value in a pre-given target temperature range based on at least the discharge setting voltage value, the lower limit value of discharge voltage and the time change amount. In this instance, the derating current value is a current value for fully extending the time left until the voltage of the battery 10 reaches the lower limit of discharge voltage in the voltage drop range. Additionally, the target temperature range may be preset corresponding to the target curve model. For example, when a target temperature range is 0-20° C., the control unit 140 may calculate a derating current value for 10° C. in the target temperature range.

Specifically, as the discharge setting voltage value and the lower limit value of discharge voltage are preset and the time change amount may be only determined for each discharge curve model, the control unit 140 may calculate the derating current value from the discharge setting voltage value, the lower limit value of discharge voltage and the time change amount by using a preset mathematical algorithm. For example, for a target curve model, the time change amount and the derating current value may have a proportional relationship.

Preferably, the control unit 140 may calculate the derating current value for the target curve model for each temperature further based on the maximum discharge current value and two or more different factors. Here, the maximum discharge current value may correspond to the target curve model. For example, when the target curve model corresponds to the state of charge of 15%, the maximum discharge current value is 359 A, and when the target curve model corresponds to the state of charge of 20% or more, the maximum discharge current value is 360 A. Additionally, one of the two or more different factors may be the internal resistance value of the battery, and the other may be the maximum resistance change ratio of the battery.

According to an embodiment, the control unit 140 may determine the derating current value $I_{D\_derate}$ for the target curve model using the following Equation 2.

$$I_{D\_derate} = \frac{V_{min} - V_{D\_set} + I_{D\_max} \times R_0}{R_0 + \left(\frac{dR}{dt}\right)_{D\_max} \Delta t_D} \quad \text{[Equation 2]}$$

In Equation 2, $I_{D\_max}$ is the maximum discharge current value, $V_{min}$ is the lower limit of discharge voltage, $V_{D\_set}$ is the discharge setting voltage, $R_0$ is the internal resistance value, $\Delta t_D$ is the time change amount, $(dR/dt)_{D\_max}$ is the maximum resistance change ratio, and $I_{D\_derate}$ is the derating current value.

Here, $R_0$ and $(dR/dt)_{D\_max}$ are two factors to which different values may be allocated by the control unit 140 based on the temperature of the battery 10.

When the target curve model is obtained from the battery 10 with the state of charge of 20%, the control unit 140 may determine values that will be allocated to $R_0$ and $(dR/dt)_{D\_max}$ of Equation 2 from the following Tables 1 and 2.

TABLE 1

| Temperature value (° C.) | Internal resistance value $R_0$ |
|---|---|
| 0 | A |
| 10 | B |
| 25 | C |
| 45 | D |

In Table 1, the internal resistance value mapped to relatively high temperature value may be smaller than the internal resistance value mapped to relatively low temperature value. For example, in Table 1, the internal resistance value B associated with 10° C. is larger than the internal resistance value D associated with 45° C. In other words, a relationship of A>B>C>D is satisfied. The relationship between the temperature and the internal resistance value defined as in Table 1 may be pre-stored in the memory unit 150 in the form of a lookup table.

TABLE 2

| Temperature value (° C.) | Maximum resistance change ratio $(dR/dt)_{D\_max}$ |
|---|---|
| 0 | E |
| 10 | F |
| 25 | G |
| 45 | H |

In Table 2, the maximum resistance change ratio associated with relatively high temperature may be larger than the maximum resistance change ratio associated with relatively low temperature. For example, in Table 2, the maximum resistance change ratio E mapped to 0° C. is smaller than the maximum resistance change ratio F associated with 10° C. In other words, a relationship of E<F<G<H is satisfied. The relationship between the temperature and the maximum resistance change ratio defined as in Table 2 may be pre-stored in the memory unit 150 in the form of a lookup table in the same way as Table 1.

Figure 4:
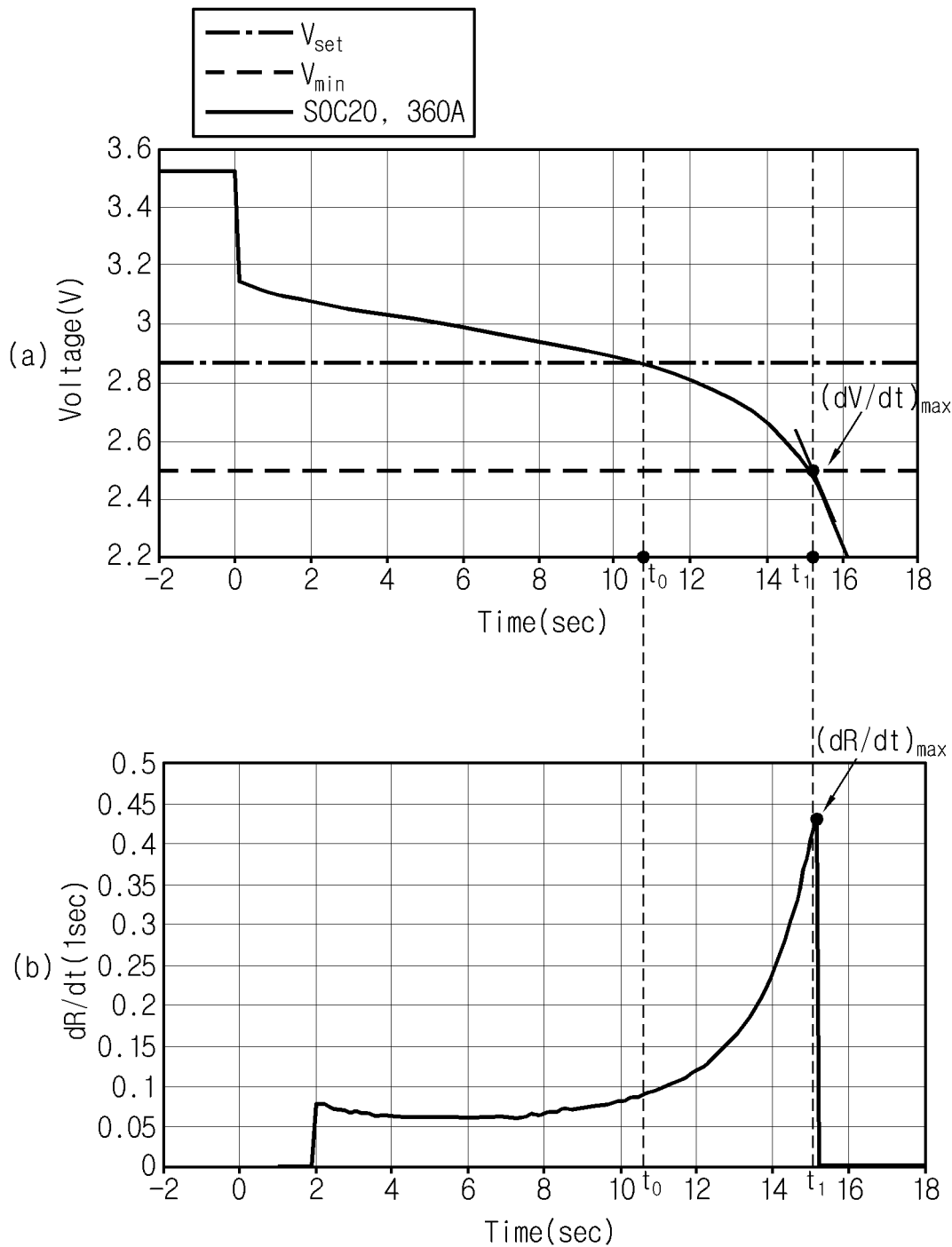
FIG. 4 is a diagram illustrating parameters of equations used when determining a derating current value in an embodiment of the present disclosure.

FIG. 4 is a diagram illustrating the parameters related to Equation 2.

The discharge curve model shown in the graph (a) of FIG. 4 is a discharge curve model corresponding to the state of charge of 20% among the plurality of discharge curve models shown in FIG. 3. It can be easily seen from the foregoing description made with reference to FIG. 3 that the allowed maximum discharge current value 360 A when the state of charge of the battery 10 is 20% is allocated to $I_{D\_max}$ of Equation 2.

The graph (b) of FIG. 4 shows a resistance change ratio over time when the battery 10 with the state of charge of 20% is discharged with 360 A. According to the Ohm's law, V=I×R, and when the two sides are differentiated by time t, $dV/dt=I_{D\_max} \times dR/dt$, wherein dR/dt is substantially the same as $(dV/dt)/I_{D\_max}$. In this instance, if the state of charge is constant, $I_{D\_max}$ is also a constant value by the first current map, and thus, dR/dt may be determined using the voltage change ratio dV/dt for each discharge curve model.

Referring to FIG. 4, in Equation 2, $R_0$ is the internal resistance value of the battery 10, and is a parameter that may be preset for each temperature through experiments and defined as in Table 1. $V_{min}$, $V_{D\_set}$ and $R_0$ may be pre-stored in the memory unit 150.

Here, the parameter to note is $(dR/dt)_{D\_max}$ $(dR/dt)_{D\_max}$ is the maximum value of (dR/dt) appearing in the voltage drop range, and as shown in the graph (b), corresponds to a value obtained by dividing a voltage change ratio or an absolute value of voltage change ratio at the point in time in which the voltage of the battery 10 reaches $V_{min}$ by $I_{D\_max}$.

$(dR/dt)_{D\_max}$ may be pre-determined using the discharge curve models measured for each state of charge and each temperature of the battery 10, and the data associated with $(dR/dt)_{D\_max}$ defined for each state of charge and each temperature may be pre-stored in the memory unit 150 as in Table 2.

Meanwhile, Equation 2 may be induced as below. The voltage of the battery 10 may be equivalently modelled by the open-circuit voltage component changing depending on the state of charge and the temperature of the battery 10, the internal resistance ($R_0$) and a circuit in which RC circuit is connected in series.

According to the circuit modeling, the voltage V of the battery 10 may be represented by the sum of three voltage components as in the following Equation 3. That is, the three voltage components may be represented by the sum of the open-circuit voltage component OCV that is determined uniquely based on the state of charge, the voltage component $IR_0$ applied to the two ends of the internal resistance $R_0$ when the current I flows, and the voltage component $I_{RC} \times R$ applied to the two ends of the RC circuit when the current $I_{RC}$ flows in the resistance R of the RC circuit.

$$V=OCV+I \times R_0+I_{RC} \times R \quad \text{[Equation 3]}$$

When the two sides of the above Equation 3 are differentiated by the time t, the following Equation 5 may be obtained.

$$dV/dt=dOCV/dt+(dI/dt) \times R_0+(dI_{RC}/dt) \times R+I_{RC} \times (dR/dt) \quad \text{[Equation 4]}$$

When it is assumed that the state of charge of the battery 10 and the current $I_{RC}$ flowing in the resistance of the RC circuit are constant for a predefined time (for example, a few seconds to a few tens of seconds), dOCV/dt and $dI_Rc/dt$ are 0, and Equation 4 may be approximated as in the following Equation 5.

$$dV/dt=(dI/dt) \times R_0+I_{RC} \times (dR/dt) \quad \text{[Equation 5]}$$

Meanwhile, assume that the current measured at the point in time to in which the discharge curve model meets the discharge setting voltage $V_{D\_set}$ is $I_0$ and the current measured at the point in time $t_1$ in which the discharge curve model meets the lower limit of discharge voltage $V_{min}$ is $I_1$. Additionally, assume that for the duration of from $t_0$ to $t_1$, $I_{RC}$ is equal to $I_1$ and (dR/dt) is constant in $(dR/dt)_{D\_max}$, when the two sides of Equation 5 are integrated over time, the following Equation 6 is obtained.

$$V_{min} - V_{D\_set} = (I_1 - I_0) \times R_0 + I_1 \times (dR/dt)_{D\_max} \times (t_1 - t_0) \quad \text{[Equation 6]}$$
$$= (I_1 - I_0) \times R_0 + I_1 \times (dR/dt)_{D\_max} \times \Delta t_D$$

Meanwhile, when Equation 6 is written with regard to $I_1$, Equation 7 is given.

$$I_1 = \frac{V_{min} - V_{D\_set} + I_0 \times R_0}{R_0 + \left(\frac{dR}{dt}\right)_{D\_max} \Delta t_D} \quad \text{[Equation 7]}$$

In Equation 7, when $I_{D\_max}$ is allocated to $I_0$, $I_1$ is the derating current value and becomes $I_{D\_derate}$ of Equation 2.

As above, the reason that $(dR/dt)_{D\_max}$ is allocated to (dR/dt) in Equation 5 is to conservatively calculate $I_{D\_derate}$ to prevent overdischarge in which the voltage of the battery 10 drops below the lower limit of discharge voltage $V_{min}$.

The control unit 140 may calculate a current derating ratio corresponding to the derating current value calculated using Equation 2. Specifically, the current derating ratio is a parameter indicating a relative size of the derating current value to the maximum discharge current value corresponding to the state of charge of the discharge curve model. For example, when the maximum discharge current value is 360 A and the derating current value for a particular temperature value is 90 A, the control unit 140 may store (360−90 A)/360 A×100%=75% as the current derating ratio for the particular temperature value in the memory unit 150.

In some cases, the control unit 140 may store only the current derating ratio among the derating current value and the current derating ratio each calculated through the above-described process in the memory unit 150. This is because a data amount required to store the current derating ratio is smaller than the derating current value.

The information output unit is configured to output at least one of a visual signal and an audio signal notifying the current derating ratio calculated by the control unit 140 from each discharge curve model for each temperature.

Optionally, the control unit 140 may determine a target power derating value $P_{D\_derate}$ from the derating current value calculated using Equation 2. $P_{D\_derate}$ may be calculated using the following Equation 8.

$$P_{D\_derate} = V_{min} \times I_{D\_derate} \quad \text{[Equation 8]}$$

The control unit 140 may transmit, in derating mode, the output parameter including at least one of the derating current value and the target derating power value to the control system 210 of the load device 200 through the communication interface 160.

The control system 210 derates the discharge current or output of the battery 10 by controlling the power conversion unit 220 using the output parameter transmitted from the control unit 140 after the delay time elapsed. That is, the control system 210 may control the power conversion unit 220 using the derating current value or the target derating output value included in the output parameter such that the magnitude of the discharge current outputted from the battery 10 is smaller than the pre-calculated derating current value or the output of the battery 10 is smaller than the target derating output value.

As a preferred example, the control system 210 controls the power conversion unit 220 to gradually derate the magnitude of the discharge current below the derating current value.

The control unit 140 may optionally include processors, application-specific integrated circuits (ASICs), chipsets, logic circuits, registers, communication modems and data processing devices known in the art to execute the above-described various control logics. Additionally, when the control logic is implemented in software, the control unit 140 may be implemented as an assembly of program modules. In this instance, the program module may be stored in the memory, and executed by the processor. The memory may be inside or outside of the processor, and may be connected to the processor with a variety of well-known computer components. Additionally, the memory may be included in the memory unit 150 of the present disclosure. Additionally, the memory refers collectively to devices in which information is stored irrespective of the type of the device and does not refer to a particular memory device.

At least one of the various control logics of the control unit 140 may be combined, and the combined control logics may be written in computer-readable code system and recorded in computer-readable recording medium. The recording medium is not limited to a particular type when it can be accessed by a processor included in a computer. For example, the recording medium includes at least one selected from the group consisting of ROM, RAM, register, CD-ROM, magnetic tape, hard disk, floppy disk and optical data recording device. Additionally, the code system may be stored and executed in computers connected via a network in distributed manner. Further, functional programs, codes and code segments for implementing the combined control logics may be readily inferred by programmers in the technical field to which the present disclosure belongs.

Figure 5:
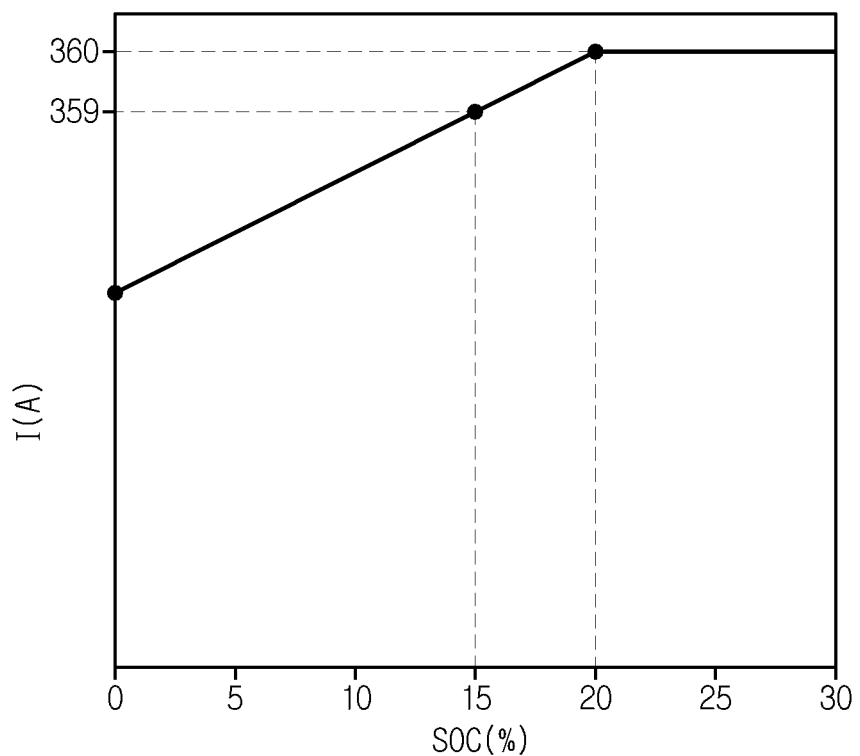
FIGS. 5 to 8 are diagrams for reference to illustrate the operation of calculating a derating current value and a current derating ratio for each temperature from each discharge curve model by a battery management apparatus according to an embodiment of the present disclosure.
Figure 6:
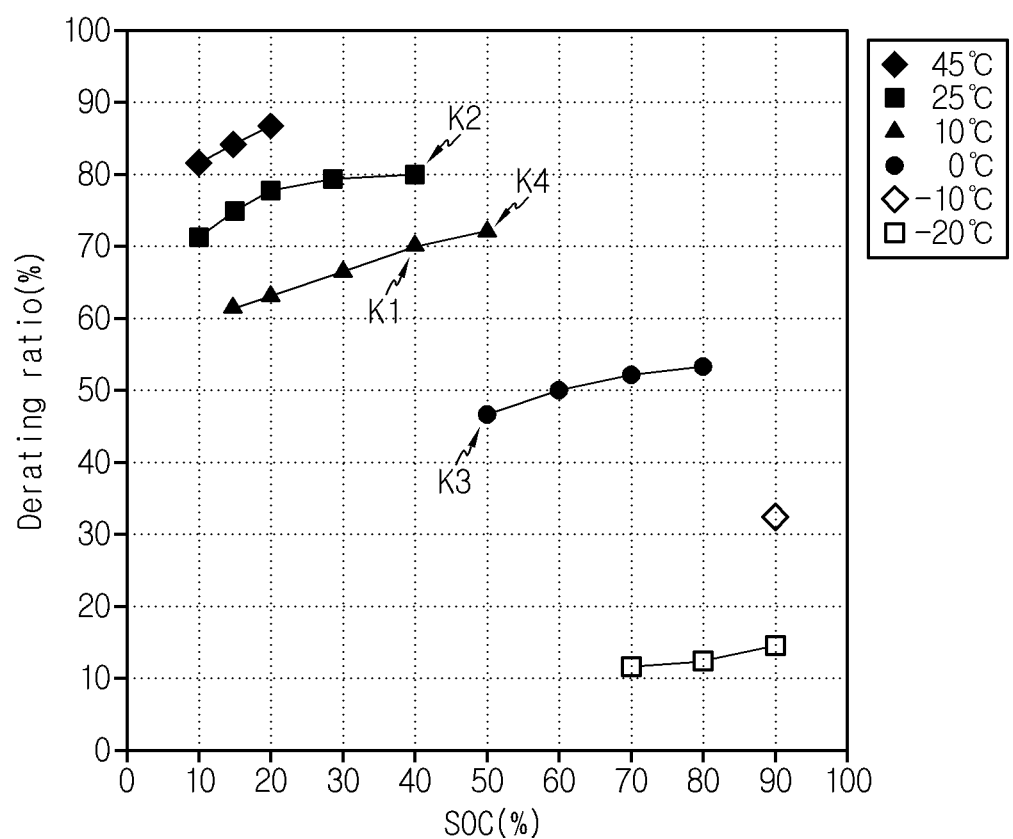
Figure 7:
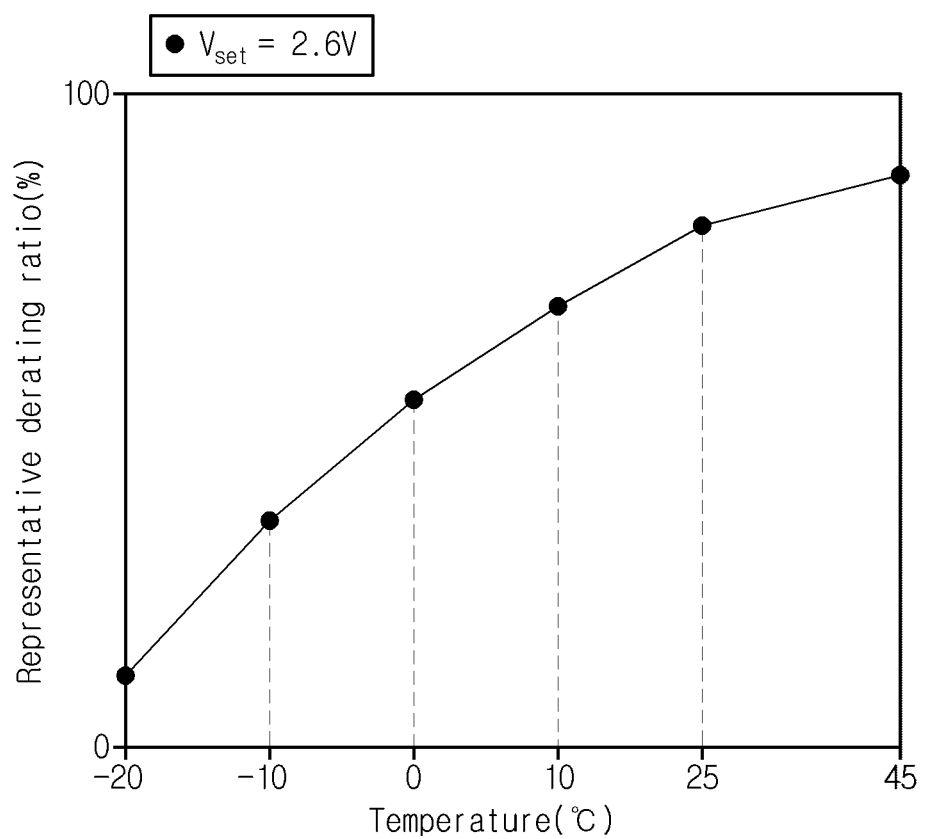
Figure 8:
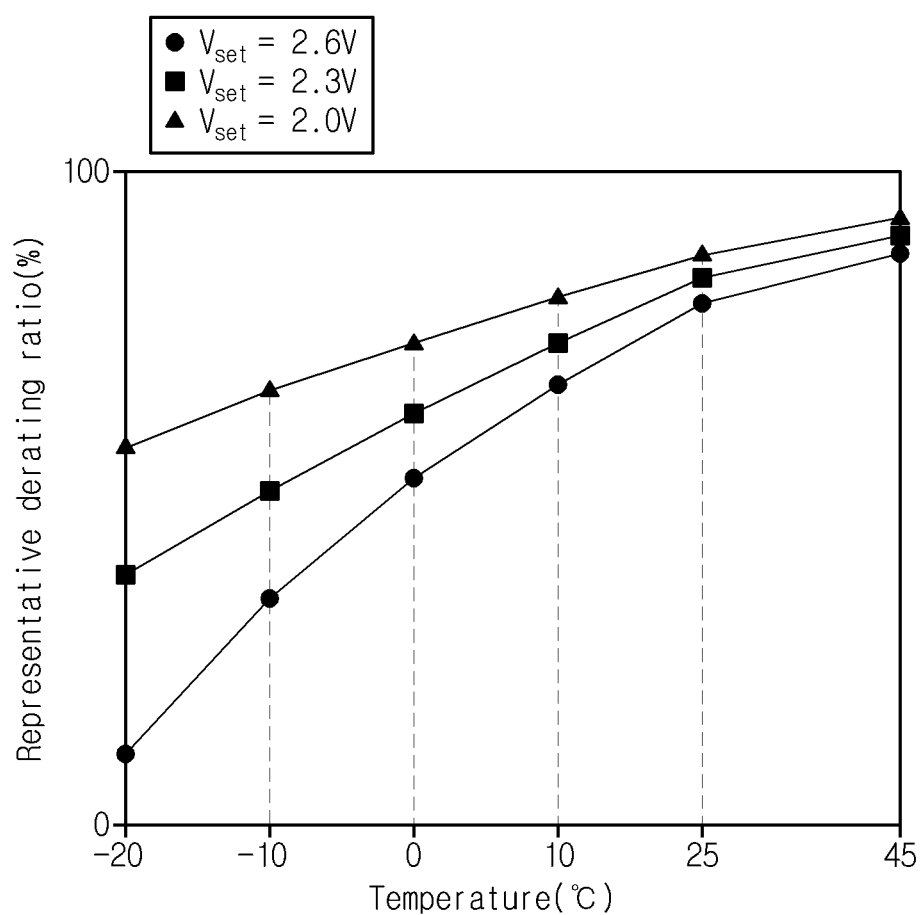

FIGS. 5 to 8 are diagrams for reference to illustrate the operation of calculating a derating current value and a current derating ratio for each temperature from each discharge curve model by the battery management apparatus according to an embodiment of the present disclosure. Specifically, FIG. 5 is a graph showing a relationship between the state of charge and the maximum discharge current value of the battery 10 defined by a preset first current map. FIG. 6 is a graph showing changes in current derating ratio as a function of the state of charge and temperature value of the battery 10. FIG. 7 is a graph showing changes in maximum representative derating ratio for each temperature derived from the graph shown in FIG. 6. FIG. 8 is a graph showing the characteristics that a representative derating ratio changes with the increasing/decreasing discharge setting voltage.

Referring to FIG. 5, the maximum discharge current value of the battery 10 continuously increases with the increasing state of charge, and after it goes above a specified point, may be uniformly maintained. Referring to FIG. 4 together, before the state of charge reaches 20%, the maximum discharge current value gradually increases to 360 A in the shape close to a straight line. Subsequently, after the state of charge reaches 20%, the maximum discharge current value is uniformly maintained at 360 A.

Referring to FIG. 6, when the discharge setting voltage is 2.6V, a current derating ratio calculated from a preset temperature value and a discharge curve model are shown. Specifically, the total of 22 (3 current derating ratios at 45° C., 5 current derating ratios at 25° C., 5 current derating ratios at 10° C., 4 current derating ratios at 0° C., 1 current derating ratio at −10° C., 4 current derating ratios at −20° C.) current derating ratios are indicated in the graph of FIG. 6.

To help understanding, in FIG. 3, the discharge curve model associated with the state of charge value of 40% is referred to as a first model, and the discharge curve model associated with the state of charge value of 50% is referred to as a second model. In this case, when a temperature value is defined, $R_0$ and $(dR/dt)_{D\_max}$ of Equation 2 may be individually set from Tables 1 and 2 for the first model and the second model. Additionally, $V_{min}$ and $V_{D\_set}$ of Equation 2 may be common in the first model and the second model, $\Delta t_D$ may be individually calculated and from each of the first model and the second model, and $I_{D\_max}$ may be individually set from the first current map (see FIG. 5) for the first model and the second model. Here, among the parameters of Equation 2, a parameter that changes depending on the temperature value may be only $R_0$ and $(dR/dt)_{D\_max}$.

<Calculation Operation of Current Derating Ratio for First Model>

Referring to FIG. 6, for the first model, two different current derating ratios K1% and K2% are calculated at two different temperature values 10° C. and 25° C. That is, for the first model, the control unit 140 may calculate the current derating ratios K1% and K2% respectively by allocating a first internal resistance value B and a first maximum resistance change ratio F mapped to a first temperature value 10° C. to $R_0$ and $(dR/dt)_{max}$ of Equation 2, and allocating a second internal resistance value C and a second maximum resistance change ratio G mapped to a second temperature value 25° C. to $R_0$ and $(dR/dt)_{max}$ of Equation 2.

<Calculation Operation of Current Derating Ratio for Second Model>

Referring to FIG. 6 again, for the second model, two different current derating ratios K3% and K4% are calculated at two different temperature values 0° C. and 10° C. That is, for the second model, the control unit 140 may calculate the current derating ratios K3% and K4% by allocating a third internal resistance value A and a third maximum resistance change ratio E mapped to a third temperature value 0° C. to $R_0$ and $(dR/dt)_{D\_max}$ of Equation 2, and a fourth internal resistance value B and a fourth maximum resistance change ratio F mapped to a fourth temperature value 10° C. to $R_0$ and $(dR/dt)_{D\_max}$ of Equation 2.

<Calculation Operation of Representative Derating Ratio for Each Temperature>

When at least one of the temperature value used in the first model and the temperature value used in the second model to calculate the current derating ratio is common, the control unit 140 may set one of the current derating ratios corresponding to the common temperature value as a representative derating ratio for the common temperature value.

For example, the temperature value used in the first model is 10° C. and 25° C., and the temperature value used in the second model is 0° C. and 10° C., and among the temperature values, 10° C. is a common temperature value. Accordingly, the control unit 140 may set a larger current derating ratio K1% between the current derating ratio K1% of the first model associated with 10° C. and the current derating ratio K4% of the second model as a representative derating ratio for the common temperature value 10° C.

Additionally, when the number of current derating ratios calculated for a temperature value (−10° C. in FIG. 6) is only one, the control unit 140 may set the current derating ratio as a representative derating ratio for the corresponding temperature value.

The control unit 140 may set representative derating ratios for all the given temperature values by iteratively performing the above-described process, and FIG. 7 is a graph showing the representative derating ratios for each temperature value. Referring to FIG. 7, it can be seen that as a plurality of preset temperature values goes from the minimum value to the maximum value, the corresponding representative derating ratios gradually increase.

Additionally, referring to FIG. 8, it can be seen that when a relatively large safety standard value from the plurality of safety standard values (e.g. 2.6V, 2.3V, 2.0V) is set as the discharge setting voltage, a relatively small representative derating ratio at the same temperature value is set. This is because the value of $(V_{min}-V_{D\_set})$ of Equation 2 increases with the increasing discharge setting voltage.

Hereinafter, a method performed by the battery management apparatus 100 to protect the battery 100 from overdischarge will be described in detail.

FIGS. 9 to 12 are flowcharts showing a battery management method according to an embodiment of the present disclosure. For convenience of description, assume that only a first discharge curve model and a second discharge curve model associated with different state of charge values are pre-stored in the memory unit 150, and current derating ratios for the two temperature values are calculated for each discharge curve model.

Figure 9:
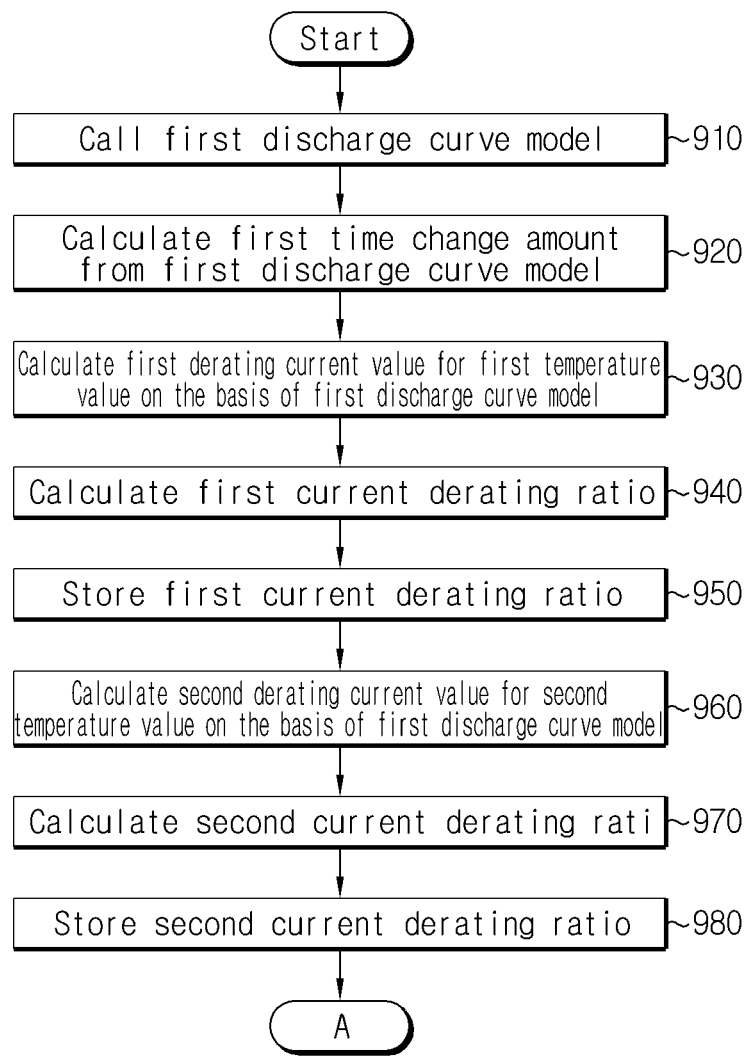
FIGS. 9 to 12 are flowcharts showing a battery management method according to an embodiment of the present disclosure.

First, referring to FIG. 9, in step 910, the control unit 140 calls the first discharge curve model from the memory unit 150. The first discharge curve model defines changes in voltage across the two ends of the battery 10 having the first state of charge value over time under the first discharge condition.

Subsequently, in step 920, the control unit 140 calculates a first time change amount from the first discharge curve model. The first time change amount is a period of time from a first point in time in which the first discharge curve model meets the discharge setting voltage value $V_{D\_set}$ to a second point in time in which the first discharge curve model meets the lower limit value of discharge voltage $V_{min}$.

Subsequently, in step 930, the control unit 140 calculates a first derating current value for a first temperature value on the basis of the first discharge curve model. The first derating current value may be calculated based on the lower limit value of discharge voltage, the discharge setting voltage value, the first time change amount, a first factor and a second factor. Here, the first factor is a first internal resistance value mapped to the first temperature value, and the second factor is a first maximum resistance change ratio mapped to the first temperature value.

Subsequently, in step 940, the control unit 140 calculates a first current derating ratio. The first current derating ratio is a parameter indicating a relative size of the first derating current value to the first maximum discharge current value mapped to the first state of charge value. The first maximum discharge current value is, for example, a parameter that is determined with reference to the first current map (see FIG. 5) defining the graph shown in FIG. 3.

Subsequently, in step 950, the control unit 140 stores the first current derating ratio in the memory unit 150. In this instance, the control unit 140 may associate the first current derating ratio with the first state of charge value and the first temperature value. Of course, the first derating current value may be stored together.

Subsequently, in step 960, the control unit 140 calculates a second derating current value for a second temperature value on the basis of the first discharge curve model. The second temperature value is different from the first temperature value. The second derating current value may be calculated based on the lower limit value of discharge voltage, the discharge setting voltage value, the first time change amount, a third factor and a fourth factor. Here, the third factor is a second internal resistance value mapped to the second temperature value, and the fourth factor is a second maximum resistance change ratio mapped to the second temperature value.

Subsequently, in step 970, the control unit 140 calculates a second current derating ratio. The second current derating ratio is a parameter indicating a relative size of the second derating current value to the first maximum discharge current value.

Subsequently, in step 980, the control unit 140 stores the second current derating ratio in the memory unit 150. In this instance, the control unit 140 may associate the second current derating ratio with the first state of charge value and the second temperature value. Of course, the second derating current value may be stored together.

Figure 10:
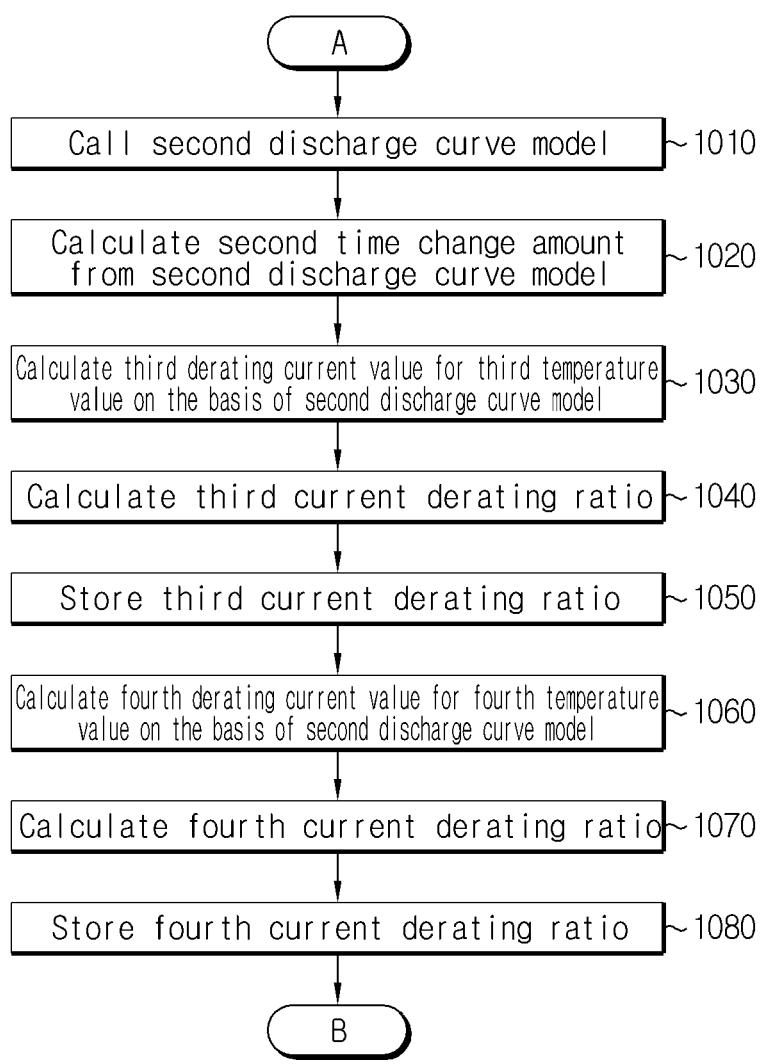

Subsequently, referring to FIG. 10, in step 1010, the control unit 140 calls the second discharge curve model from the memory unit 150. The second discharge curve model defines changes in voltage across the two ends of the battery 10 having the second state of charge value over time under the second discharge condition.

Subsequently, in step 1020, the control unit 140 calculates a second time change amount from the second discharge curve model. The second time change amount is a period of time from a third point in time in which the second discharge curve model meets the discharge setting voltage value $V_{D\_Set}$ to a fourth point in time in which the second discharge curve model meets the lower limit value of discharge voltage $V_{min}$.

Subsequently, in step 1030, the control unit 140 calculates a third derating current value for a third temperature value on the basis of the second discharge curve model. The third derating current value may be calculated based on the lower limit value of discharge voltage, the discharge setting voltage value, the second time change amount, a fifth factor and a sixth factor. Here, the fifth factor is a third internal resistance value mapped to the third temperature value, and the sixth factor a third maximum resistance change ratio mapped to the third temperature value.

Subsequently, in step 1040, the control unit 140 calculates a third current derating ratio. The third current derating ratio is a parameter indicating a relative size of the third derating current value to the second maximum discharge current value mapped to the second state of charge value. The second maximum discharge current value is, for example, a parameter that is determined with reference to the first current map defining the graph shown in FIG. 3.

Subsequently, in step 1050, the control unit 140 stores the third current derating ratio in the memory unit 150. In this instance, the control unit 140 may associate the third current derating ratio with the second state of charge value and the third temperature value. Of course, the third derating current value may be stored together.

Subsequently, in step 1060, the control unit 140 calculates a fourth derating current value for a fourth temperature value on the basis of the second discharge curve model. The fourth temperature value is different from the third temperature value. The fourth derating current value may be calculated based on the lower limit value of discharge voltage, the discharge setting voltage value, the second time change amount, a seventh factor and an eighth factor. Here, the seventh factor is a fourth internal resistance value mapped to the fourth temperature value, and the eighth factor is a fourth maximum resistance change ratio mapped to the fourth temperature value.

Subsequently, in step 1070, the control unit 140 calculates a fourth current derating ratio. The fourth current derating ratio is a parameter indicating a relative size of the fourth derating current value to the second maximum discharge current value.

Subsequently, in step 1080, the control unit 140 stores the fourth current derating ratio in the memory unit 150. In this instance, the control unit 140 may associate the fourth current derating ratio with the second state of charge value and the fourth temperature value. Of course, the fourth derating current value may be stored together. Prior to describing FIG. 11, because temperature values to be used for each discharge curve model are pre-stored in the memory unit 150, the control unit 150 may obtain a temperature value commonly used in two different discharge curve models.

Figure 11:
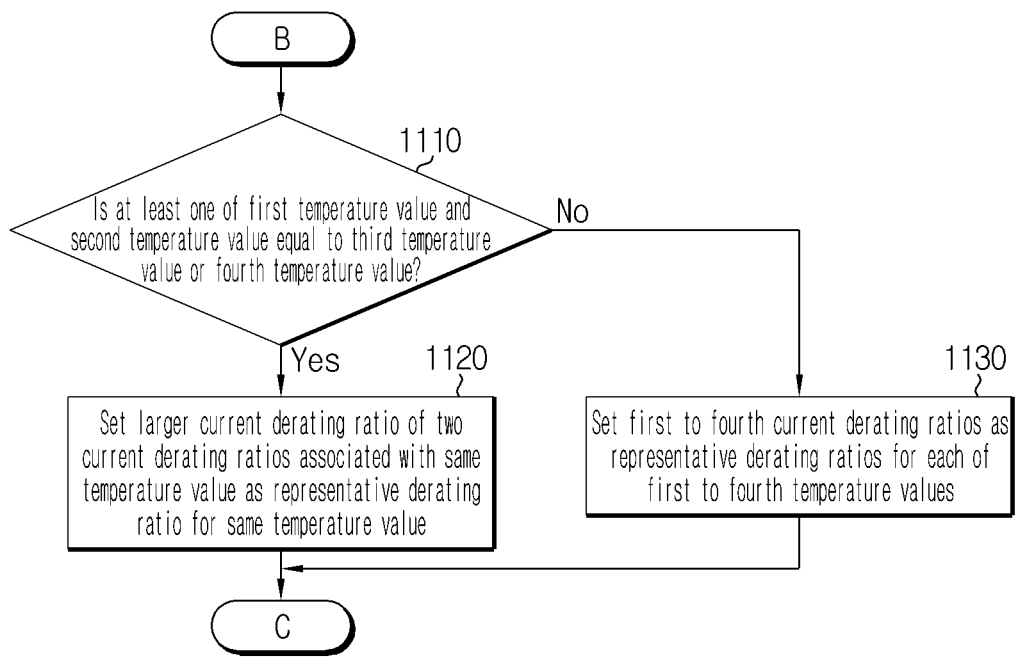

Referring to FIG. 11, in step 1110, the control unit 140 determines if any of the first temperature value and the second temperature value is equal to the third temperature value or the fourth temperature value. For example, when first temperature value<second temperature value=third temperature value<fourth temperature value, because the second temperature value is equal to the third temperature value, "YES" is determined in step 1110. In contrast, when first temperature value<second temperature value<third temperature value<fourth temperature value, neither the first temperature value nor the second temperature value is equal to the third temperature value or the fourth temperature value, and in step 1110, "NO" is determined. When the determination result in step 1110 is "YES", the process moves to step 1120. In contrast, when the determination result in step 1110 is "NO", the process moves to step 1130.

In step 1120, the control unit 140 sets a larger current derating ratio of the two current derating ratios associated with the same temperature value as a representative derating ratio for the same temperature value. For example, when second temperature value=third temperature value, the control unit 140 compares the second current derating ratio and the third current derating ratio, and when the second current derating ratio is larger, sets the second current derating ratio as a representative derating ratio for the second temperature value, and when the third current derating ratio is larger, sets the third current derating ratio as a representative derating ratio for the second temperature value.

Along with this or separately from this, the control unit 140 may set the current derating ratio associated with each of the remaining temperature values as a representative derating ratio of the corresponding temperature value. For example, when first temperature value<second temperature value=third temperature value<fourth temperature value, the control unit 140 may set the first current derating ratio as a representative derating ratio for the first temperature value, and the fourth current derating ratio as a representative derating ratio for the fourth temperature value.

In step 1130, the control unit 140 sets the first to fourth current derating ratios as representative derating ratios for each of the first to fourth temperature values. That is, the control unit 140 sets the first current derating ratio as a representative derating ratio for the first temperature value, the second current derating ratio as a representative derating ratio for the second temperature value, the third current derating ratio as a representative derating ratio for the third temperature value, and fourth current derating ratio as a representative derating ratio for the fourth temperature value.

The representative derating ratio for each temperature set through step 1120 or 1130 may be stored in the memory unit 150.

Figure 12:
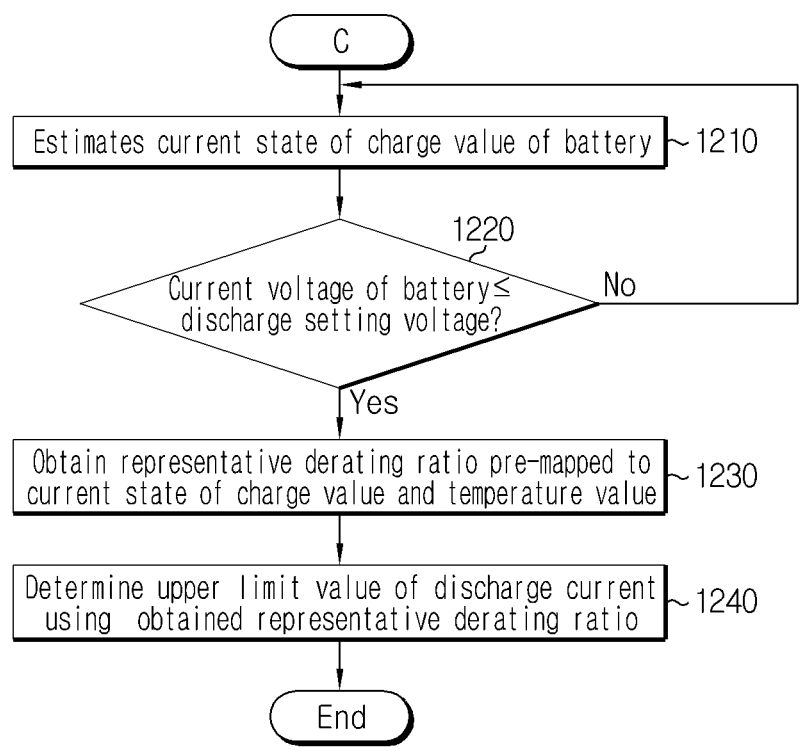

FIG. 12 is a flowchart chronologically showing the steps of the method for limiting the discharge current of the battery 10 based on the representative derating ratio for each temperature stored in the memory unit 150 as described above.

Subsequently, referring to FIG. 12, in step 1210, the control unit 140 estimates a current state of charge value of the battery 10. For example, the control unit 140 may estimate a current state of charge value of the battery 10 based on the voltage value, the current value and temperature value of the battery 10 measured by the voltage measuring unit 110, the current measuring unit 120 and the temperature measuring unit 130.

In step 1220, the control unit 140 determines if the current voltage of the battery 10 is equal to or less than the discharge setting voltage value. When the determination result in step 1220 is "YES", the process moves to step 1230.

In step 1230, the control unit 140 obtains any one representative derating ratio pre-mapped to the current state of charge value and the temperature value of the battery 10 among the representative derating ratios pre-stored in the memory unit 150. For example, referring to FIG. 6, when the current state of charge value and the temperature value are 20% and 10° C. respectively, K1% may be obtained from the memory unit 150.

In step 1240, the control unit 140 determines an upper limit value of discharge current of the battery 10 using the obtained representative derating ratio. For example, when the maximum discharge current value mapped to the current state of charge value is 360 A and the representative derating ratio obtained through step 1230 is 80%, 360 A×(100%−80%)=72 A may be determined to be the upper limit value. The control unit 140 may limit the discharge current below the determined upper limit value. For example, the control unit 140 may determine a duty cycle of a pulse width modulation signal based on a difference between the current discharge current and the upper limit value, and transmit a signal notifying the determined frequency to the control system 210 through the communication interface 160. The control system 210 may adjust the turn-on and turn-off of a switching device connected between the battery 10 and the load 230 according to the duty cycle transmitted from the control unit 140, eventually to prevent the discharge current of the battery 10 from exceeding the upper limit value. When the upper limit value is determined by step 1240, the control unit 140 may return to step 1210.

Although the description was made on the basis of the operation of the apparatus 100 for limiting the discharge current of the battery 10, i.e., the overcharge protection operation with reference to FIGS. 3 to 12, it is obvious that the apparatus 100 may perform an operation for limiting the charge current of the battery 10, i.e., an overcharge protection operation.

More specifically, the charge curve models may be obtained similar to the constant current discharge test for obtaining the discharge curve models described above with reference to FIG. 3. That is, a plurality of charge curve models may be obtained by conducting the constant charge test while maintaining the same temperature for each preset state of charge value of the battery 10. In this instance, the magnitude of charge current used in each constant current charge test sets the maximum charge current value set by the HPPC method.

To use Equation 2 used to determine the derating current value related to overdischarge protection in determining a derating current value related to overcharge protection, $I_{C\_derate}$, $V_{max}$, $V_{C\_set}$, $I_{C\_max}$, $(dR/dt)_{C\_max}$, $\Delta t_C$ may be respectively substituted for $I_{D\_derate}$, $V_{min}$, $V_{D\_set}$, $(dR/dt)_{D\_max}$, $\Delta t_D$ described previously. $I_{C\_derate}$ is the derating current value related to overcharge protection, $V_{max}$ is the upper limit of charge voltage, $V_{C\_set}$ is the charge setting voltage, $I_{C\_max}$ is the maximum charge current value, $(dR/dt)_{C\_max}$ is the maximum value of $(dR/dt)$ appearing in the voltage rise range $V_{max}$~$V_{C\_set}$, and $\Delta t_C$ is the time change ratio from the point in time in which the charge curve model meets the charge setting voltage $V_{C\_set}$ to the point in time in which the charge curve model meets the upper limit of charge voltage $V_{max}$. The charge curve models may be also pre-stored in the memory unit 150 with the above parameters related to the overcharge protection operation.

For example, a first charge curve model may define changes in voltage of the battery 10 having a first state of charge value over time under first charge condition, and a second charge curve model may define changes in voltage of the battery 10 having a second state of charge value over time under second charge condition. In the similar way as the foregoing description made with reference to FIG. 3, the first charge condition may be under which the battery 10 is charged with a first maximum charge current value corresponding to the first state of charge value above the upper limit of charge voltage at a designated temperature (for example, 25° C.), and the second charge condition may be under which the battery 10 is charged with a second maximum charge current value corresponding to the second state of charge value above the upper limit of charge voltage at the same temperature as the first charge condition.

The control unit 140 may determine the maximum discharge current value for each state of charge using a second current map pre-stored in the memory unit 150. Here, similar to the first current map, the second current map may be a data structure in the form of a lookup table that defines the maximum charge current values associated with each of the plurality of state of charges. When the state of charge of the battery 10 is constant, $I_{C\_max}$ is also a constant value by the second current map. Accordingly, the control unit 140 may determine $(dR/dt)_{C\_max}$ for each charge curve model using the voltage change dV/dt in the voltage rise section.

That is, as the overdischarge protection operation and the overcharge protection operation are merely classified based on whether the battery 10 is being charged or discharged, the embodiments related to the overdischarge protection operation may be applied in operating the overcharge protection operation only with varying relevant parameters.

In describing various embodiments of the present disclosure, it should be understood that the components designated by '~unit' are elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions is acknowledged, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

What is claimed is:

1. A battery management apparatus, comprising:
  a memory configured to store a plurality of discharge curve models including a first discharge curve model associated with a first state of charge value, wherein the first discharge curve model defines a change in voltage of a battery having the first state of charge value over time under a first discharge condition; and
  a processor connected to the memory and configured to:
    communicate with the memory,
    call the first discharge curve model stored in the memory,
    calculate, from the first discharge curve model, a first time change amount from a first point in time in which the first discharge curve model meets a discharge setting voltage value that is set higher than a lower limit value of discharge voltage of the battery to a second point in time in which the first discharge curve model meets the lower limit value of discharge voltage,
    calculate a first derating current value for a first temperature value based on the lower limit value of discharge voltage, the discharge setting voltage value and the first time change amount,
    calculate a first current derating ratio indicating a value of the first derating current value to a first maximum discharge current value mapped to the first state of charge value,
    store the first current derating ratio in association with the first state of charge value and the first temperature value in the memory, and
    discharge the battery according to the first derating current value.

2. The battery management apparatus according to claim 1, wherein the processor is configured to calculate the first derating current value further based on the first maximum discharge current value, a first factor and a second factor, and the first factor is a first internal resistance value of the battery mapped to the first temperature value, and the second factor is a first maximum resistance change ratio of the battery mapped to the first temperature value.

3. The battery management apparatus according to claim 2, wherein the processor is configured to calculate the first derating current value using the following Equation 1:

$$I_{D\_derate} = \frac{V_{min} - V_{D\_set} + I_{D\_max} \times R_0}{R_0 + \left(\frac{dR}{dt}\right)_{D\_max} \Delta t_D}$$ [Equation 1]

where $I_{D\_max}$ is the first maximum discharge current value, $V_{min}$ is the lower limit of discharge voltage, $V_{D\_set}$ is the discharge setting voltage, $R_0$ is the first internal resistance value, $\Delta t_D$ is the first time change amount, $(dR/dt)_{D\_max}$ is the first maximum resistance change ratio, and $I_{D\_derate}$ is the first derating current value.

4. The battery management apparatus according to claim 2, wherein the processor is further configured to:
calculate a second derating current value for a second temperature value based on the lower limit value of discharge voltage, the discharge setting voltage value, the first time change amount, a third factor and a fourth factor, the third factor is a second internal resistance value of the battery mapped to the second temperature value, and the fourth factor is a second maximum resistance change ratio of the battery mapped to the second temperature value,
calculate a second current derating ratio indicating a relative size of the second derating current value to the first maximum discharge current value, and
store the second current derating ratio in association with the first state of charge value and the second temperature value in the memory.

5. The battery management apparatus according to claim 4, wherein the memory is configured to further store a second state of charge value that is different from the first state of charge value and a second discharge curve model associated with the second state of charge value, wherein the second discharge curve model defines a change in voltage of the battery having the second state of charge value over time under a second discharge condition, and
wherein the processor is further configured to:
calculate, from the second discharge curve model, a second time change amount from a third point in time in which the second discharge curve model meets the discharge setting voltage value to a fourth point in time in which the second discharge curve model meets the lower limit value of discharge voltage,
calculate a third derating current value for a third temperature value based on the lower limit value of discharge voltage, the discharge setting voltage value and the second time change amount,
calculate a third current derating ratio indicating a relative size of the third derating current value to a second maximum discharge current value mapped to the second state of charge value, and
store the third current derating ratio in association with the second state of charge value and the third temperature value in the memory.

6. The battery management apparatus according to claim 5, wherein the processor calculates the third derating current value further based on the second maximum discharge current value, a fifth factor and a sixth factor, and
the fifth factor is a third internal resistance value of the battery mapped to the third temperature value, and the sixth factor is a third maximum resistance change ratio of the battery mapped to the third temperature value.

7. The battery management apparatus according to claim 6, wherein the processor is configured to calculate a fourth derating current value for a fourth temperature value based on the lower limit value of discharge voltage, the discharge setting voltage value, the second time change amount, a seventh factor and an eighth factor, wherein the seventh factor is a fourth internal resistance value of the battery mapped to the fourth temperature value, and the eighth factor is a fourth maximum resistance change ratio of the battery corresponding to the fourth temperature value,
calculate a fourth current derating ratio indicating a relative size of the fourth derating current value to the second maximum discharge current value, and
store the fourth current derating ratio in association with the second state of charge value and the fourth temperature value in the memory.

8. The battery management apparatus according to claim 7, wherein when the second temperature value is equal to the third temperature value, the processor is configured to set a larger current derating ratio of the second current derating ratio and the third current derating ratio as a representative derating ratio for the third temperature value.

9. The battery management apparatus according to claim 8, further comprising:
a voltage measuring unit configured to measure a discharge voltage of the battery, the voltage measuring unit including a voltage measuring circuit;
a current measuring unit configured to measure a current of the battery, the current measuring unit including a hall sensor or sense resistor; and
a temperature measuring unit configured to measure a temperature of the battery, the temperature measuring unit including a thermocouple,
wherein the processor is configured to:
estimate a current state of charge value of the battery based on a voltage value, a current value and a temperature value measured by the voltage measuring unit, the current measuring unit and the temperature measuring unit, respectively,
when the voltage of the battery is equal to or less than the discharge setting voltage value, obtain a representative derating ratio mapped to the current state of charge value and the temperature value from the memory, and
determine an upper limit value of a discharge current of the battery using the obtained representative derating ratio.

10. The battery management apparatus according to claim 1, wherein the memory further stores a plurality of preset safety standard values, and
the processor allocates the plurality of safety standard values to the discharge setting voltage value in a sequential order according to a preset rule, and calculates the first current derating ratio in a state that each safety standard value is set as the discharge setting voltage value.

11. A battery management method, comprising:
calling a first discharge curve model associated with a first state of charge value from a plurality of pre-stored discharge curve models, wherein the first discharge curve model defines a change in voltage of a battery having the first state of charge value over time under a first discharge condition;

calculating, from the first discharge curve model, a first time change amount from a first point in time in which the first discharge curve model meets a discharge setting voltage value that is set higher than a lower limit value of discharge voltage of the battery to a second point in time in which the first discharge curve model meets the lower limit value of discharge voltage;

calculating a first derating current value for a first temperature value based on the lower limit value of discharge voltage, the discharge setting voltage value, the first time change amount, a first factor and a second factor, wherein the first factor is a first internal resistance value of the battery mapped to the first temperature value, and the second factor is a first maximum resistance change ratio of the battery mapped to the first temperature value;

calculating a first current derating ratio indicating a value of the first derating current value to a first maximum discharge current value mapped to the first state of charge value;

storing the first current derating ratio in association with the first state of charge value and the first temperature value in a memory; and discharging the battery according to the first derating current value.

* * * * *